United States Patent
Takahashi

(10) Patent No.: US 10,890,791 B2
(45) Date of Patent: Jan. 12, 2021

(54) LIGHT CONTROL DEVICE

(71) Applicant: TOPPAN PRINTING CO., LTD., Tokyo (JP)

(72) Inventor: Hiroshi Takahashi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/526,197

(22) Filed: Jul. 30, 2019

(65) Prior Publication Data

US 2019/0353945 A1 Nov. 21, 2019

Related U.S. Application Data

(63) Continuation of application No. PCT/JP2018/003565, filed on Feb. 2, 2018.

(30) Foreign Application Priority Data

Feb. 2, 2017 (JP) ................. 2017-017603

(51) Int. Cl.
*G02F 1/133* (2006.01)
*H02M 1/08* (2006.01)
*H03K 17/687* (2006.01)

(52) U.S. Cl.
CPC .......... *G02F 1/13306* (2013.01); *H02M 1/08* (2013.01); *H03K 17/6871* (2013.01)

(58) Field of Classification Search
None
See application file for complete search history.

(56) References Cited

U.S. PATENT DOCUMENTS

| 10,447,174 B1* | 10/2019 | Porter, Jr. ............... H02M 1/08 |
| 2004/0196523 A1* | 10/2004 | Nito .................... G02F 1/13318 |
| | | 359/239 |
| 2004/0263095 A1* | 12/2004 | Min .................... H05B 41/3927 |
| | | 315/291 |

(Continued)

FOREIGN PATENT DOCUMENTS

| JP | 2001-142048 | 5/2001 |
| JP | 2004-198505 | 7/2004 |

(Continued)

OTHER PUBLICATIONS

International Search Report dated Apr. 24, 2018, in corresponding International Patent Application No. PCT/JP2018/003565.

(Continued)

*Primary Examiner* — Ryan Crockett

(57) ABSTRACT

A light control device includes: a light control element including a first layer stack and a second layer stack which include electrodes provided on base members, respectively, and a liquid crystal layer sandwiched between the first and second layer stacks; a switching element connected between an AC power supply and the light control element; a comparator that detects whether or not the AC power supply is higher than a first voltage that is higher than 0 V and is lower than a maximum value of the AC power supply; and a control circuit that performs PWM control or PFM control on the switching element if the AC power supply is higher than the first voltage.

10 Claims, 12 Drawing Sheets

(56) References Cited

U.S. PATENT DOCUMENTS

| | | | | |
|---|---|---|---|---|
| 2006/0152649 A1* | 7/2006 | Yanagida | ............. | G02F 1/1334 |
| | | | | 349/61 |
| 2010/0134406 A1* | 6/2010 | Maruyama | ........... | G09G 3/3426 |
| | | | | 345/102 |
| 2012/0313985 A1* | 12/2012 | Gotoh | ................ | G09G 3/3413 |
| | | | | 345/691 |
| 2016/0329829 A1* | 11/2016 | Ayai | ..................... | H02M 1/126 |
| 2018/0019611 A1* | 1/2018 | Zhang | .................. | H01F 27/425 |
| 2018/0234032 A1* | 8/2018 | Araki | ....................... | H02P 6/28 |

FOREIGN PATENT DOCUMENTS

| | | |
|---|---|---|
| JP | 2013-72895 | 4/2013 |
| WO | 2011/121860 | 10/2011 |

OTHER PUBLICATIONS

Written Opinion of the International Searching Authority dated Apr. 24, 2018 in corresponding International Patent Application No. PCT/JP2018/003565.

English Translation by WIPO of the International Preliminary Report on Patentability dated Aug. 15, 2019 in corresponding International Patent Application No. PCT/JP2018/003565.

\* cited by examiner

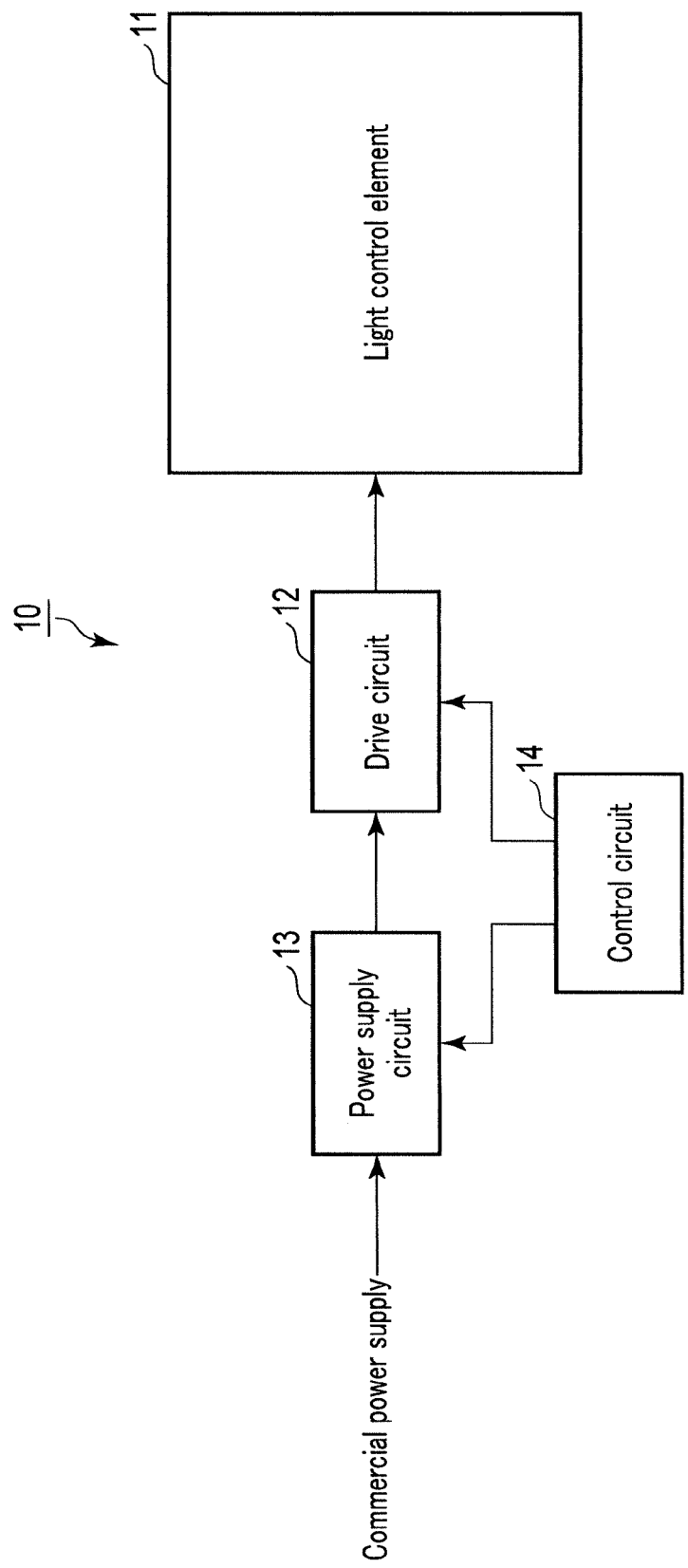
F I G. 1

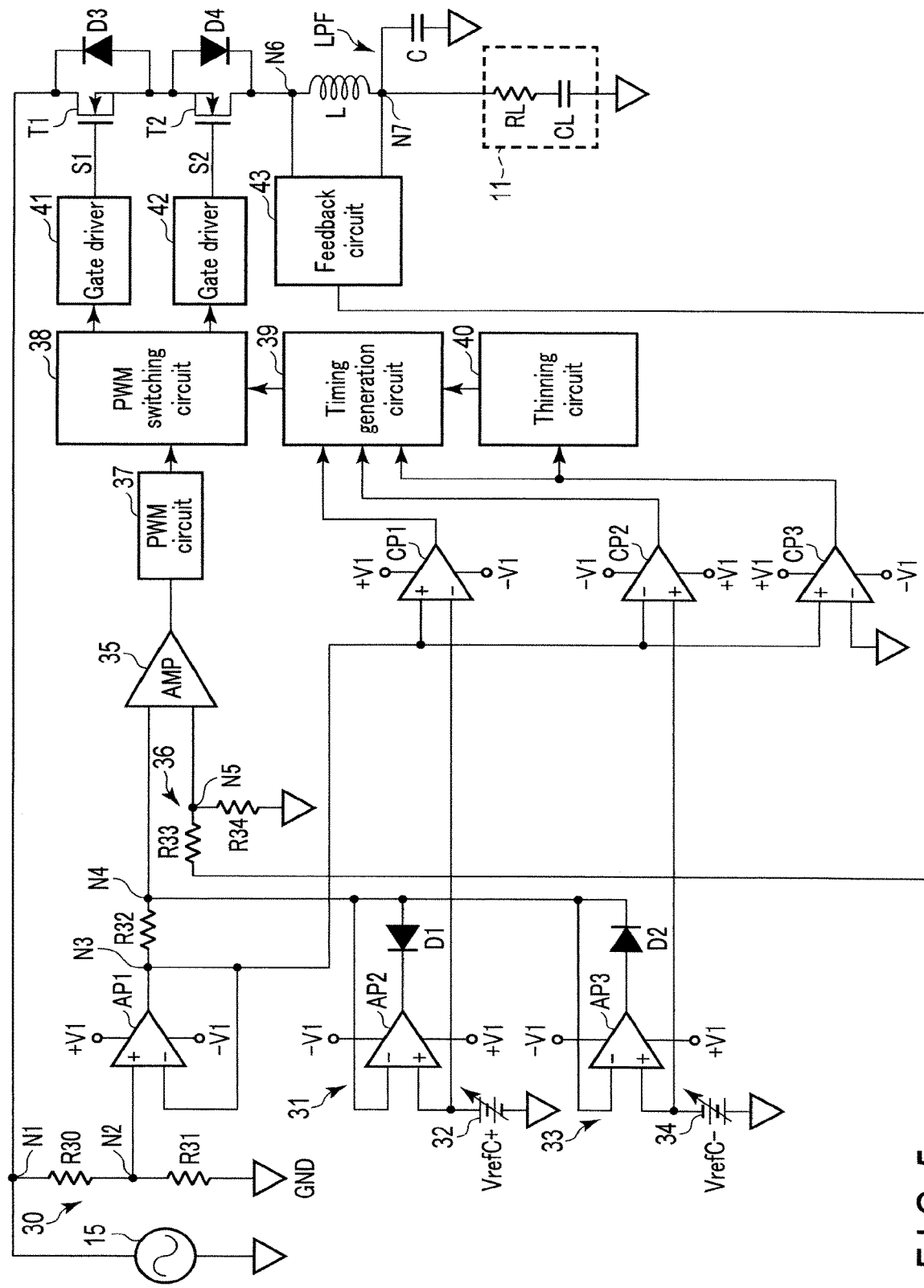
F I G. 5

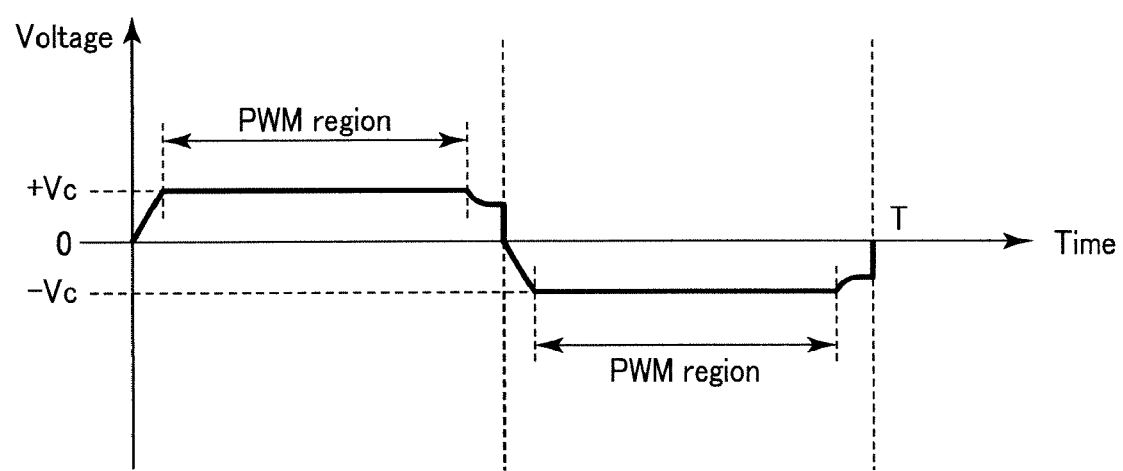
F I G. 10

LIGHT CONTROL DEVICE

CROSS-REFERENCE TO RELATED APPLICATIONS

This application is a Continuation Application of PCT Application No. PCT/JP2018/003565, filed Feb. 2, 2018, and based upon and claiming the benefit of priority from Japanese Patent Application No. 2017-017603, filed Feb. 2, 2017, the entire contents of all of which are incorporated herein by reference.

FIELD

The present invention generally relates to a light control device using a liquid crystal.

BACKGROUND

There is known a light control device using a polymer dispersed liquid crystal or a polymer network liquid crystal capable of performing bright display without necessarily requiring alignment processing and with no need for a polarizing plate. A liquid crystal layer (light control layer) includes a liquid crystal material and a polymer material. The ordinary light refractive index of the liquid crystal material and the refractive index of the polymer material are set to be approximately the same.

The light control device is, for example, in a scattering state when a voltage is not applied to the liquid crystal layer, and in a transmissive state when a voltage is applied to the liquid crystal layer. For the light control device, for example, it is desirable to use a commercial power supply (effective voltage of 100 V, frequency of 60 Hz or 50 Hz) when considering its use in the home or workplace. However, since the crest value (maximum value) of a commercial power supply is $100\sqrt{2}$ V, the light control device cannot be driven when the withstand voltage of the liquid crystal layer is lower than the crest value of the commercial power supply.

To address this, one option is to reduce a commercial power supply using a variable auto-transformer called "slidac" and drive the light control device using a reduced AC power supply. In this case, the light control device is increased in both size and weight.

Another option is to convert a commercial power supply into a direct current with an AC/DC power supply circuit, and then drive the light control device using this direct current voltage. In this case, the power supply sees a decrease in conversion efficiency, and the light control device sees an increase in power consumption.

SUMMARY

According to a first aspect of the present invention, there is provided a light control device comprising:

a light control element including a first layer stack and a second layer stack which include electrodes provided on base members, respectively, and a liquid crystal layer sandwiched between the first and second layer stacks;

a first switching element connected between an AC power supply and the light control element;

a first comparator that detects whether or not the AC power supply is higher than a first voltage that is higher than 0 V and is lower than a maximum value of the AC power supply; and a control circuit that performs PWM (pulse width modulation) control or PFM (pulse frequency modulation) control on the first switching element if the AC power supply is higher than the first voltage.

BRIEF DESCRIPTION OF THE DRAWINGS

FIG. 1 is a block diagram of a light control device according to a first embodiment.

FIG. 5 is a circuit diagram of a drive circuit.

FIG. 10 is a diagram for explaining an AC voltage applied to a light control element according to the modification.

DETAILED DESCRIPTION

Figure 2:
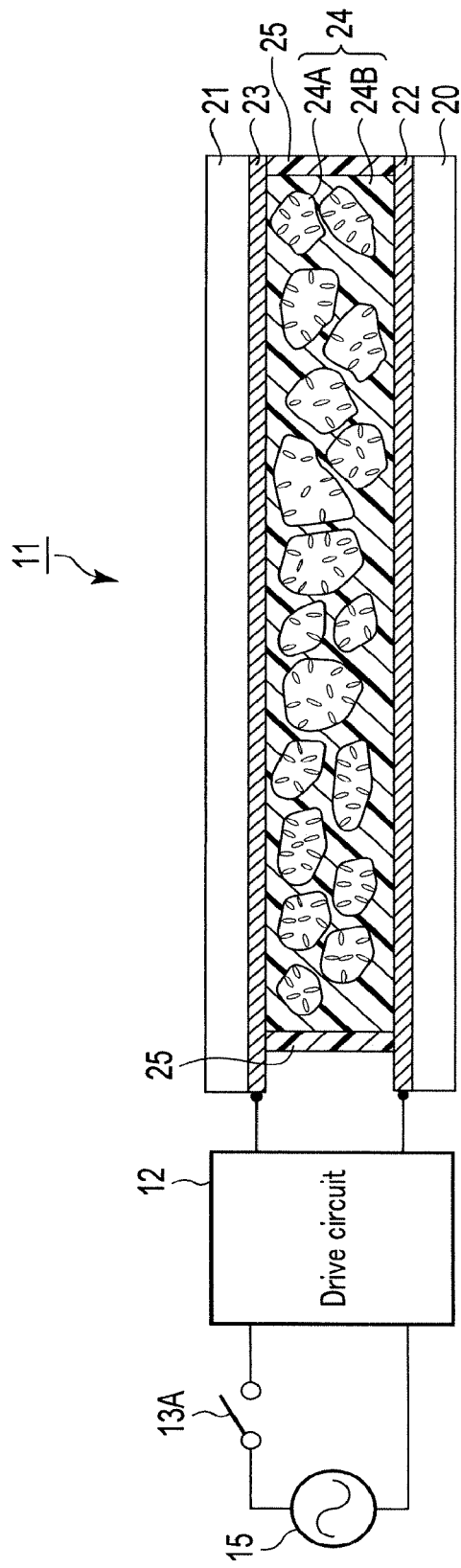
FIG. 2 is a cross-sectional view of a light control element.

A description will now be given of the embodiments with reference to the accompanying drawings. It should be noted that the drawings are schematic or conceptual, and the dimensions and scales of the drawings are not necessarily the same as the actual products. Where the same portion is depicted in different drawings, the dimensions and scale of one drawing may be different from those of another. Several embodiments described below merely show exemplary apparatuses and methods that implement the technical ideas of the present invention. The technical ideas are not limited by the element shapes, structures, arrangements, etc. described below. In the description below, structural elements having substantially the same functions and configurations will be denoted by the same reference symbols, and a repetitive description of such elements will be given only where necessary.

First Embodiment

[1] Configuration of Light Control Device 10

FIG. 1 is a block diagram of a light control device 10 according to a first embodiment of the present invention. The light control device 10 includes a light control element 11, a drive circuit 12, a power supply circuit 13, and a control circuit 14.

The light control element 11 is an element capable of controlling the light transmittance. The light control element 11 is made of, for example, a light control film. The light control film is a functional film capable of instantly switching between transparency and opacity (white turbidity) depending on the power being on/off. An example of the configuration of the light control element 11 will be described later.

The drive circuit 12 applies a voltage to the light control element 11 to drive the light control element 11. The circuit configuration of the drive circuit 12 will be described later.

The power supply circuit 13 receives an AC power supply from the outside. As an example, in the present embodiment, a commercial AC power supply (commercial power supply) is adopted as the AC power supply. The commercial power supply is a general power supply supplied from an electric power company or the like for industrial use or household use. It is an AC power supply. The commercial power supply has the effective voltage of 100 V, the crest value (maximum value) of $100\sqrt{2}$ V, and the frequency of 60 Hz or 50 Hz. The power supply circuit 13 supplies a commercial power supply to the light control element 11. Furthermore, the power supply circuit 13 generates a predetermined voltage (DC voltage) to be used as a power supply for an active element included in the drive circuit 12, and supplies this DC voltage to the drive circuit 12.

The control circuit 14 controls the drive circuit 12 and the power supply circuit 13. The control circuit 14 supplies control signals to the drive circuit 12 and the power supply circuit 13, so that the drive circuit 12 and the power supply circuit 13 can perform desired operations.

[1-1] Configuration of Light Control Element 11

Next, the configuration of the light control element 11 will be described. FIG. 2 is a cross-sectional view of the light control element 11. The light control element 11 can take a given planar shape, for example, a square. When the light control element 11 is a light control film, the light control film is processed in accordance with an outline of a region to be attached.

The light control element 11 includes base members 20 and 21 disposed opposite to each other, and a liquid crystal layer (light control layer) 24 disposed between the base members 20 and 21. The base members 20 and 21 are made of a transparent member, for example, a transparent film. For example, a polyethylene terephthalate (PET) film, a polyethylene (PE) film, and a polycarbonate (PC) film can be used as the base members 20 and 21.

The liquid crystal layer 24 includes a liquid crystal material 24A and a polymer material 24B. The liquid crystal layer 24 is made of polymer dispersed liquid crystal (PDLC) or polymer network liquid crystal (PNLC). The polymer dispersed liquid crystal is composed of a complex in which a liquid crystal material is dispersed in a matrix made of a polymer material; that is, the polymer dispersed liquid crystal has a configuration in which the liquid crystal is phase-separated in the matrix. The polymer network liquid crystal is composed of a complex in which a liquid crystal material having a continuous phase is filled in a three-dimensional network structure (polymer network) made of a polymer material. As the polymer material, a photocurable resin can be used. For example, in PDLC, a solution in which a liquid crystal material is mixed with a photopolymerization type polymer precursor (monomer) is irradiated with ultraviolet light to polymerize the monomer, thereby forming a polymer, and the liquid crystal is dispersed in the matrix made of the aforementioned polymer.

A transparent electrode 22 is provided on the base member 20 so as to be in contact with the liquid crystal layer 24. A transparent electrode 23 is provided on the base member 21 so as to be in contact with the liquid crystal layer 24. The transparent electrodes 22 and 23 are made of a material having both light transparency and conductivity, and are made of, for example, ITO (indium tin oxide).

The light control element 11 includes connection terminals (not shown) electrically connected to the transparent electrodes 22 and 23, respectively, and provided to enable an electrical connection to the drive circuit 12. The connection terminals are made of metal (e.g., gold, silver, copper, aluminum, etc.).

The liquid crystal layer 24 is sealed between the transparent electrodes 22 and 23 by a sealing member 25. The sealing member 25 is formed in a manner to surround the liquid crystal layer 24. The sealing member 25 is made of, for example, a light curing resin.

[1-2] Operation of Liquid Crystal Layer 24

Next, a broad operation of the liquid crystal layer (light control layer) 24 will be described.

In the liquid crystal layer 24, the ordinary light refractive index of the liquid crystal material and the refractive index of the polymer material are set to be approximately the same. As the liquid crystal material, for example, a positive (P-type) nematic liquid crystal having positive dielectric anisotropy is used.

As shown in FIG. 2, the switching element 13A is turned off, thereby stopping supply from the commercial power supply 15 to the light control element 11. The switching element 13A is included in the power supply circuit 13, and the operation of the switching element 13A is controlled by the control circuit 14. In this OFF state, no voltage is applied to the liquid crystal layer 24.

When no voltage (no electric field) is applied to the liquid crystal layer 24, liquid crystal molecules enter a random state with respect to the interface of the polymer matrix (or polymer network). In this case, the refractive indexes of the liquid crystal material and the polymer matrix differ, thereby ensuring that incident light is scattered at the interface of the polymer matrix. That is, in a state in which the liquid crystal molecules are not aligned, the liquid crystal layer 24 is in a high haze state. At this time, the liquid crystal layer 24 is in a cloudy state, while the light control element 11 is in an opaque state. In this manner, the light control element 11 can shield an object from an observer. The haze value is an index related to the transparency of a member and represents the degree of haze. A smaller haze value indicates a higher transparency.

Figure 3:
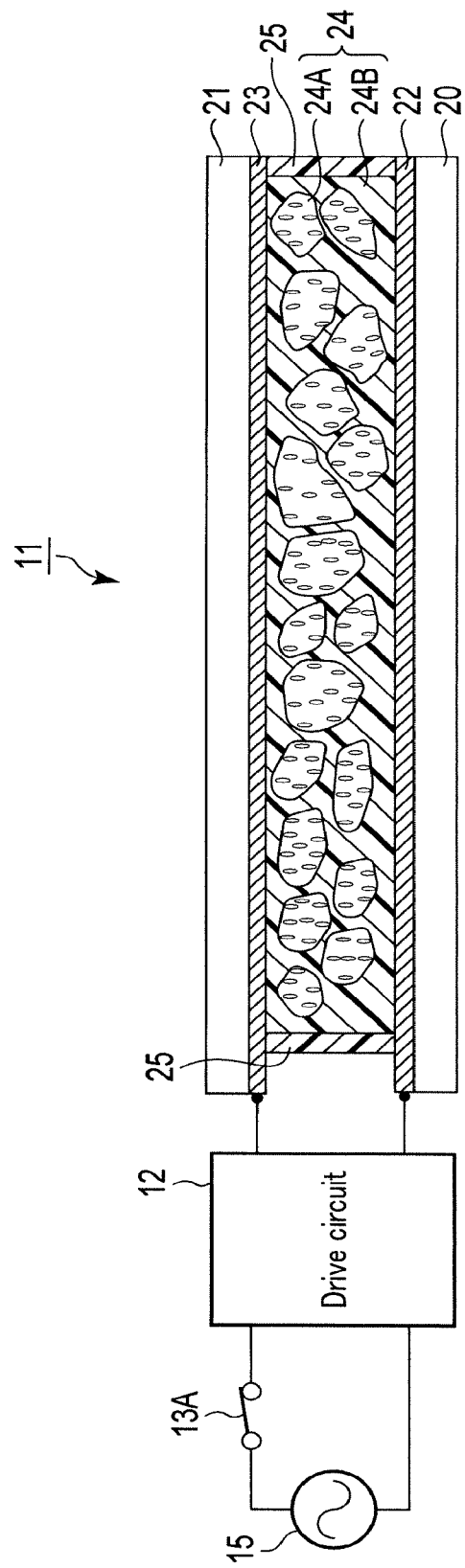
FIG. 3 is a cross-sectional view for explaining the alignment of a liquid crystal layer.

On the other hand, as shown in FIG. 3, the switching element 13A is turned on, so that the commercial power supply 15 is supplied to the light control element 11. In this ON state, a voltage is applied to the liquid crystal layer 24.

When a voltage is applied to the liquid crystal layer 24, the major axes (directors) of the liquid crystal molecules align in a direction substantially perpendicular to the electrode planes. In this case, the refractive index of the liquid crystal material is approximately the same as that of the polymer matrix, so that the incident light is hardly scattered in the liquid crystal layer 24 and passes through the liquid crystal layer 24. That is, in a state in which the liquid crystal molecules are aligned, the liquid crystal layer 24 is in a low haze state. At this time, the liquid crystal layer 24 is in a transparent state, and the light control element 11 is also in a transparent state. Therefore, the observer can observe an object through the light control element 11.

This embodiment describes the case in which the light control element enters an opaque state when no current is applied, and a transparent state when a current is applied. However, the present invention is not limited to this case. The present invention is also applicable to a reverse type that enters a transparent state when no current is applied, and an opaque state when a current is applied.

[1-3] Equivalent Circuit of Light Control Element 11

Figure 4:
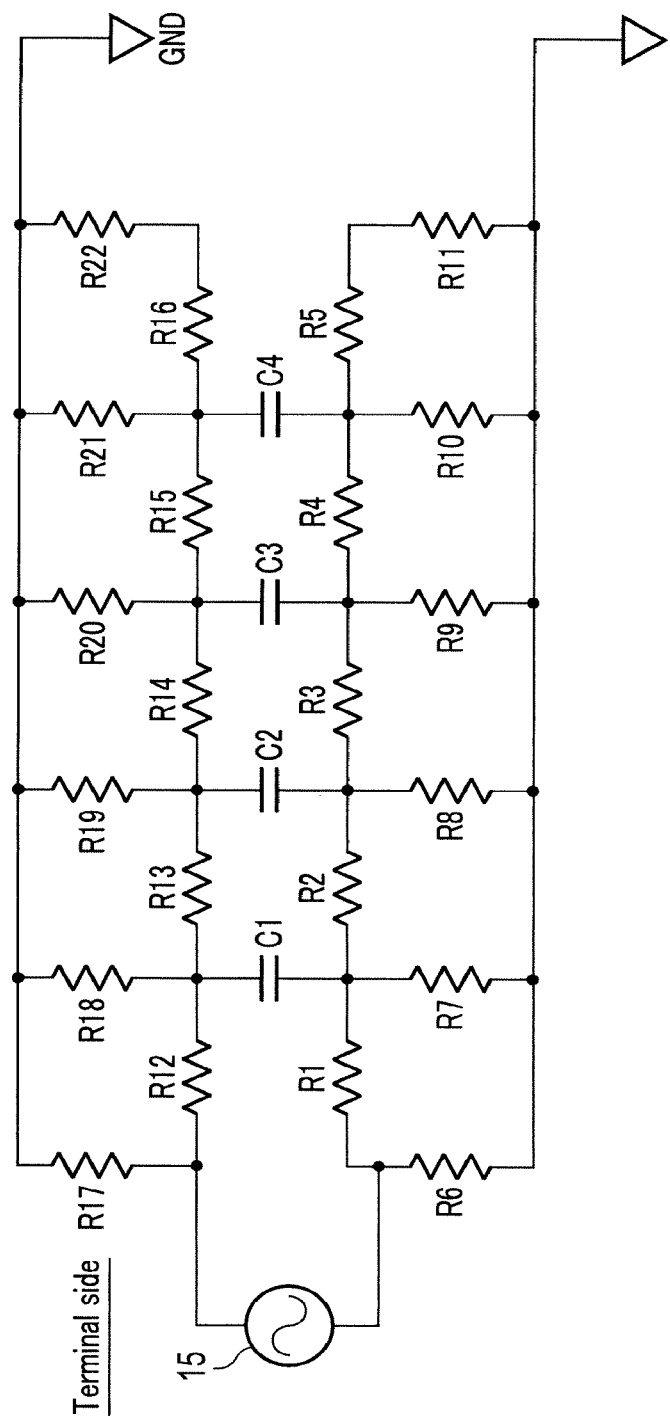
FIG. 4 is an equivalent circuit diagram of the light control element.

Next, an equivalent circuit of the light control element 11 will be described. FIG. 4 is an equivalent circuit diagram of the light control element 11.

The transparent electrode 22 is formed in a planar shape. Therefore, the transparent electrode 22 constitutes a plurality of resistance components R1 to R11 so as to extend from a terminal side (a side close to a terminal connected to the drive circuit 12) to a distal side (a side opposite to the terminal).

Similarly, the transparent electrode 23 is formed in a planar shape. Therefore, the transparent electrode 23 constitutes a plurality of resistance components R12 to R22 so as to extend from the terminal side to the distal side.

The liquid crystal layer 24 constitutes a plurality of capacitance components C1 to C4 connected between the transparent electrode 22 and the transparent electrode 23.

As can be understood from FIG. 4, in the light control element 11, the voltage is high on the terminal side and decreases toward the distal side.

[1-4] Configuration of Drive Circuit 12

Next, the configuration of the drive circuit 12 will be described. FIG. 5 is a circuit diagram of the drive circuit 12.

A node N1 is connected to the commercial power supply 15 via the power supply circuit 13. To the node N1, a voltage dividing circuit 30 is connected. The voltage dividing circuit 30 includes resistors R30 and R31 connected in series between the node N1 and a ground terminal GND. The voltage dividing circuit 30 outputs, from a node N2, an AC voltage having the maximum value lower than that of the commercial power supply 15. For example, the voltage dividing circuit 30 reduces the voltage of the node N1 to about ½0. The voltage dividing ratio of the voltage dividing circuit 30 is optimally set in accordance with the withstand voltages of a plurality of active elements connected to a subsequent stage of the voltage dividing circuit 30.

An operational amplifier AP1 has a non-inverted input terminal connected to the node N2, and an inverted input terminal connected to an output terminal of the operational amplifier AP1 itself. The operational amplifier AP1 constitutes a voltage follower. The operational amplifier AP1 has a positive power supply terminal to which a positive voltage "+V1" is applied, and a negative power supply terminal to which a negative voltage "−V1" is applied. For example, the positive voltage "+V1" is about +15 V, while the negative voltage "−V1" is about −15 V. A DC power supply applied to another active element described later is also the same as in the operational amplifier AP1.

The operational amplifier AP1 has an output terminal connected to one end of a resistor R32 via a node N3. The other end of the resistor R32 is connected to a node N4.

A voltage limiter 31 includes an operational amplifier AP2, a diode D1, and a variable power supply 32. The voltage limiter 31 is an upper limit limiter, and limits a positive voltage to a predetermined voltage. An operational amplifier AP2 has an inverted input terminal connected to the node N4, and a non-inverted input terminal connected to a positive electrode of the variable power supply 32. The operational amplifier AP2 has an output terminal connected to a cathode of the diode D1. The diode D1 has an anode connected to the node N4. The variable power supply 32 is a DC power supply and supplies a positive reference voltage "VrefC+" to the non-inverted input terminal of the operational amplifier AP2. The reference voltage "VrefC+" is variable, and the voltage limiter 31 is capable of adjusting a positive-side limit voltage in accordance with the reference voltage "VrefC+". The reference voltage "VrefC+" can be freely set by the control circuit 14 or a user from the outside.

A voltage limiter 33 includes an operational amplifier AP3, a diode D2, and a variable power supply 34. The voltage limiter 33 is a lower limit limiter, and limits a negative voltage to a predetermined voltage. An operational amplifier AP3 has an inverted input terminal connected to the node N4, and a non-inverted input terminal connected to a negative electrode of the variable power supply 34. The operational amplifier AP3 has an output terminal connected to an anode of the diode D2. A cathode of the diode D2 is connected to the node N4. The variable power supply 34 is a DC power supply and supplies a negative reference voltage "VrefC−" to the non-inverted input terminal of the operational amplifier AP3. The reference voltage "VrefC−" is variable, and the voltage limiter 33 is capable of adjusting a negative-side limit voltage in accordance with the reference voltage "VrefC−". The reference voltage "VrefC−" can be freely set by the control circuit 14 or a user from the outside.

An error amplifier 35 has a first input terminal connected to the node N4 and a second input terminal connected to a voltage dividing circuit 36. The voltage dividing circuit 36 includes resistors R33 and R34 connected in series between a feedback circuit 43 described later and a ground terminal GND. The voltage dividing circuit 36 outputs, from a node N5, a voltage lower than an output of the feedback circuit 43. The node N5 between the resistors R33 and R34 is connected to a second input terminal of the error amplifier 35. The voltage dividing ratio of the voltage dividing circuit 36 is set to be the same as that of the voltage dividing circuit 30. Each resistor included in the voltage dividing circuit 36 is set to, for example, about ⅒ of each resistor included in the voltage dividing circuit 30.

A comparator CP1 has a non-inverted input terminal connected to the node N3 and an inverted input terminal connected to the positive electrode of the variable power supply 32. The comparator CP1 has an output terminal connected to a timing generation circuit 39. The comparator CP1 compares an output of the operational amplifier AP1 with the reference voltage "VrefC+", and sends the comparison result to the timing generation circuit 39.

A comparator CP2 has an inverted input terminal connected to the node N3 and a non-inverted input terminal connected to the negative electrode of the variable power supply 34. The comparator CP2 has an output terminal connected to the timing generation circuit 39. The comparator CP2 compares an output of the operational amplifier AP1 with the reference voltage "VrefC−", and sends the comparison result to the timing generation circuit 39.

A comparator CP3 has a non-inverted input terminal connected to the node N3 and an inverted input terminal connected to the ground terminal GND. Voltage of 0 V is applied to the ground terminal GND. The comparator CP3 has an output terminal connected to the timing generation circuit 39. The comparator CP3 constitutes a zero crossing circuit. That is, the comparator CP3 detects a point (the "zero crossing point") at which a voltage of the AC power supply becomes zero.

The transistors (switching elements) T1 and T2 are formed of MOS transistors or bipolar transistors. Described in the present embodiment is an example in which an N-channel MOS transistor (or a power MOS transistor), for example, is used as the transistors T1 and T2.

The transistor T1 has a drain connected to the node N1, a source connected to a source of the transistor T2, and a gate connected to a gate driver 41. The transistor T2 has a drain connected to a low pass filter LPF via a node N6, and a gate connected to a gate driver 42.

A diode (also called a "feedback diode") D3 as a rectifying element is connected in parallel to the transistor T1. The diode D3 has an anode connected to the source of the transistor T1, and a cathode connected to a drain of the transistor T1. Similarly, a diode D4 is connected in parallel to the transistor T2. The diode D4 has an anode connected to a source of the transistor T2, and a cathode connected to a drain of the transistor T2.

When the transistor T1 is formed of a MOS transistor, a parasitic diode of the MOS transistor T1 plays a role of the diode D3, thereby eliminating the need to newly add the diode D3. Similarly, when the transistor T2 is formed of a MOS transistor, a parasitic diode of the MOS transistor T2 plays a role of the diode D4, thereby eliminating the need to newly add the diode D4. When the transistors T1 and T2 are formed of bipolar transistors, the diodes D3 and D4 are connected in parallel to the bipolar transistors T1 and T2, respectively.

The low pass filter LPF includes an inductor L and a capacitor C. That is, the low pass filter LPF is formed of an LC low pass filter. The inductor L has one end connected to node N6 and the other end connected to one electrode of the capacitor C via a node N7. The other electrode of the capacitor C is connected to the ground terminal GND.

The light control element 11 is connected between the node N7 and the ground terminal GND. When expressed as an equivalent circuit, the light control element 11 includes a resistive load RL and a capacitive load CL, as understood from FIG. 4.

The feedback circuit 43 is connected in parallel to the inductor L via the nodes N6 and N7. The feedback circuit 43 detects a voltage of the inductor L, and feeds back the detected voltage to the error amplifier 35 via the voltage dividing circuit 36. A voltage of the inductor L substantially corresponds to a voltage applied to the light control element 11.

The error amplifier 35 amplifies a difference between a voltage of the node N4 and that of the node N5. An output of the error amplifier 35 is sent to a PWM circuit 37. A voltage of the node N4 is an AC voltage substantially corresponding to an AC voltage obtained by multiplying an AC voltage of the commercial power supply 15 by, for example, 1/20. A voltage of the node N5 is a voltage substantially corresponding to a voltage obtained by multiplying a voltage of the inductor L by, for example, 1/20. An output of the error amplifier 35 is sent to a PWM circuit 37.

The PWM circuit 37 performs PWM control using an output of the error amplifier 35. Pulse width modulation (PWM) is a method of changing the width (pulse width) of a pulse signal without changing the frequency of the pulse signal. The PWM circuit 37 decreases the pulse width when an output (error) of the error amplifier 35 is large, and increases the pulse width when an output of the error amplifier 35 is small. That is, the PWM circuit 37 includes a high frequency oscillator, and controls the duty ratio of a pulse signal by using an output of the error amplifier 35.

In the present embodiment, the PWM control has been described as an example; however, the present invention is not limited to this, and PFM control may be applied. Pulse frequency modulation (PFM) is a method of changing the frequency of a pulse signal without changing the pulse width. When the PFM control is applied, the frequency of the pulse signal is made low in a period during which further reduction of voltage is desired.

A thinning circuit 40 controls timing for thinning out a partial period (cycle) of an AC voltage (AC waveform). That is, the drive circuit 12 is capable of partially or periodically thinning an AC waveform applied to the light control element 11. An output of the thinning circuit 40 is sent to the timing generation circuit 39. Operations of the thinning circuit 40 will be described in the second embodiment.

The timing generation circuit 39 controls timing for generating a pulse signal for PWM control by using outputs of the comparators CP1 to CP3 and an output of the thinning circuit 40. An output of the timing generation circuit 39 is sent to a PWM switching circuit 38.

By using the output of the timing generation circuit 39, the PWM switching circuit 38 executes control to switch between periods in which the PWM control is performed and not performed. In a period in which the PWM control is performed, the PWM switching circuit 38 executes the PWM control (that is, control of the pulse width) using the output of the PWM circuit 37. In a period in which the PWM control is not performed, the PWM switching circuit 38 does not execute the PWM control (that is, the transistor T1 or the transistor T2 is turned on) regardless of the output of the PWM circuit 37.

The gate driver 41 applies a gate voltage to the transistor T1 based on the control of the PWM switching circuit 38 to control the switching operation of the transistor T1. The gate driver 42 applies a gate voltage to the transistor T2 based on the control of the PWM switching circuit 38 to control the switching operation of the transistor T2. The voltage levels of the gate drivers 41 and 42 are optimally set in accordance with the characteristics of transistors T1 and T2, respectively.

[2] Operation of Light Control Device 10

Figure 6:
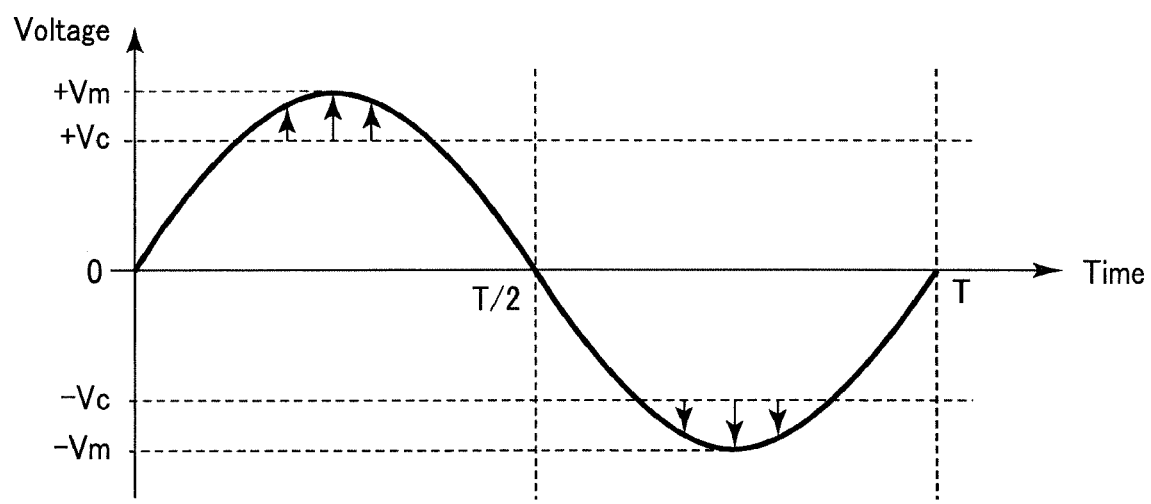
FIG. 6 is a diagram for explaining an AC waveform of a commercial power supply.

Operations of the light control device 10 configured as described above will be described. FIG. 6 is a diagram for explaining an AC waveform of the commercial power supply 15.

The commercial power supply 15 has a positive maximum value "+Vm", a negative minimum value "−Vm", and a cycle T. The positive maximum value and the negative minimum value are expressed as "+Vm=+100√2" and "−Vm=−100√2".

The withstand voltage of the light control element 11 is defined in accordance with the characteristics of its components, in particular, the characteristics of the liquid crystal layer 24. The light control element 11 has a positive limit voltage "+Vc" and a negative limit voltage "−Vc". Their relation is expressed as "Vc<Vm", in which, for example, Vc=20 to 120 V. In this description, a range expressed using the term "to" includes numerical values before and after this term. The parts shown by the arrows in FIG. 6 are parts in which the commercial power supply 15 exceeds the withstand voltage of the light control element 11.

In this embodiment, while a commercial power supply is used as a power supply of the light control device 10, an AC voltage applied to the light control element 11 is controlled so as to be no less than the limit voltage "−Vc" and no more than the limit voltage "+Vc".

Figure 7:
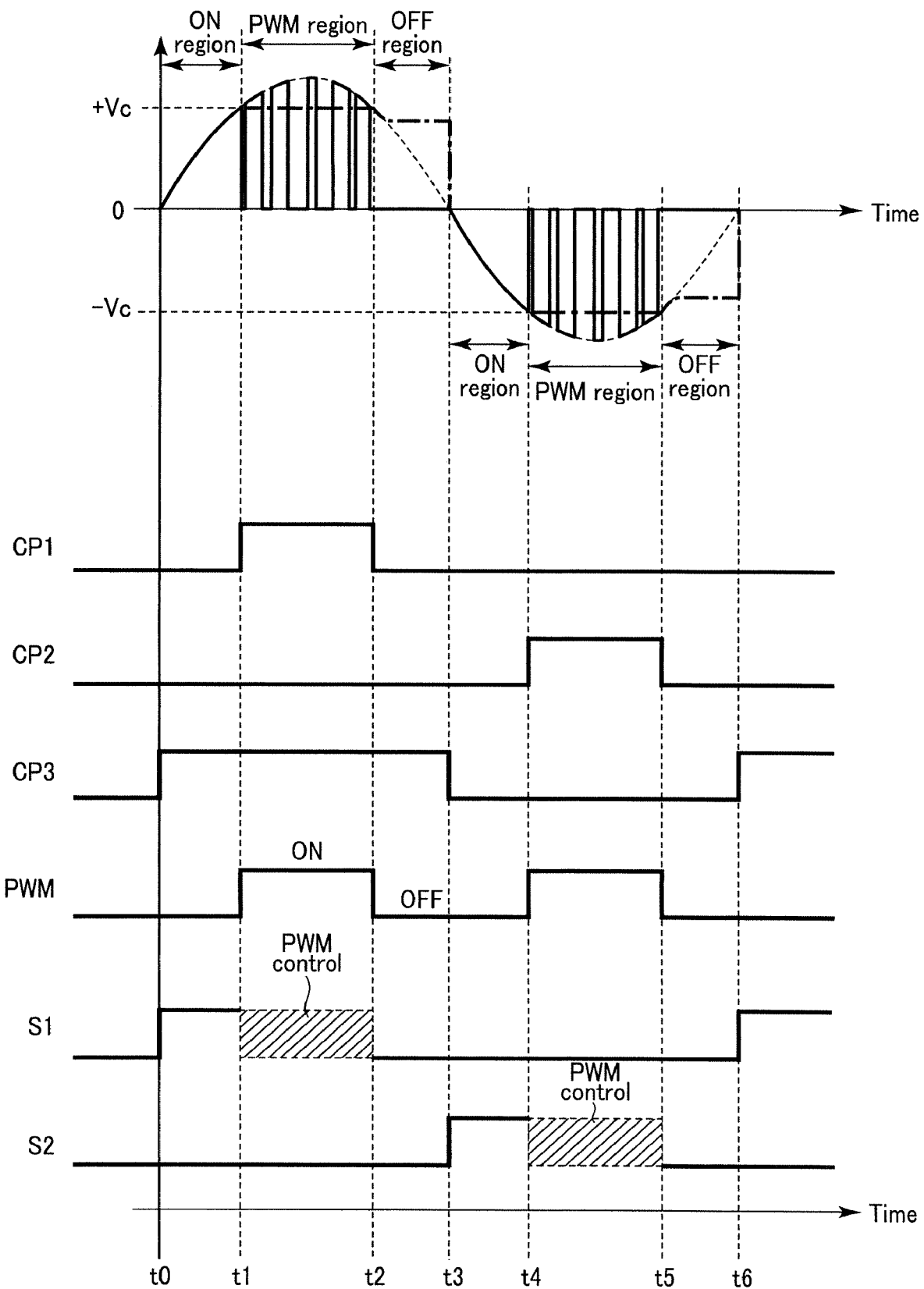
FIG. 7 is a timing chart for explaining operations of the drive circuit according to the first embodiment.

FIG. 7 is a timing chart for explaining the operation of the drive circuit 12.

At time t0, a voltage of the commercial power supply 15 becomes 0 V and then transits to the positive side. At time t0, the comparator CP3 for zero crossing detects that a voltage of the commercial power supply 15 has reached 0 V, and outputs a high level. The gate driver 41 outputs a high level as a signal S1. This turns on the transistor T1.

At time t1, when a voltage of the commercial power supply 15 becomes higher than the positive limit voltage "+Vc", the comparator CP1 outputs a high level. The reference voltage "VrefC+" applied from the variable power supply 32 to the comparator CP1 is set to about ½₀ of the limit voltage "+Vc". When an output of the comparator CP1 becomes high level, the PWM switching circuit 38 turns on the PWM control. That is, the PWM switching circuit 38 sends a pulse signal for PWM control to the gate driver 41. The gate driver 41 supplies a pulse signal as the signal S1 to the gate of the transistor T1. The pulse width (duty ratio) of the signal S1 is controlled by the PWM circuit 37.

At time t2, when a voltage of the commercial power supply 15 becomes lower than the positive limit voltage "+Vc", the comparator CP1 outputs a low level. When an output of the comparator CP1 becomes low level, the PWM switching circuit 38 turns off the PWM control. The gate driver 41 outputs a low level as the signal S1. This turns off the transistor T1. After the transistor T1 is turned off, the applied voltage of the light control element 11 is maintained by a capacitive load CL of the light control element 11.

At time t3, a voltage of the commercial power supply 15 becomes 0 V and then transits to the negative side. At time t3, the comparator CP3 for zero crossing detects that a voltage of the commercial power supply 15 has become 0 V, and outputs a low level. The gate driver 42 outputs a high level as a signal S2. This turns on the transistor T2.

At time t4, when a voltage of the commercial power supply 15 becomes lower than the negative limit voltage "−Vc", the comparator CP2 outputs a high level. The reference voltage "VrefC−" applied from the variable power supply 34 to the comparator CP2 is set to about ½₀ of the limit voltage "−Vc". When an output of the comparator CP2 becomes high level, the PWM switching circuit 38 turns on the PWM control. That is, the PWM switching circuit 38 sends a pulse signal for PWM control to the gate driver 42. The gate driver 42 supplies a pulse signal as the signal S2 to the gate of the transistor T2. The pulse width (duty ratio) of the signal S2 is controlled by the PWM circuit 37.

At time t5, when a voltage of the commercial power supply 15 becomes higher than the negative limit voltage "−Vc", the comparator CP2 outputs a low level. When an output of the comparator CP2 becomes low level, the PWM switching circuit 38 turns off the PWM control. The gate driver 42 outputs a low level as the signal S2. This turns off the transistor T2. After the transistor T2 is turned off, a voltage applied to the light control element 11 is maintained by a capacitive load CL of the light control element 11.

At time t6, a voltage of the commercial power supply 15 becomes 0 V and then transits to the positive side. At time t6, the comparator CP3 for zero crossing outputs a high level. Thereafter, a similar control is performed, and the drive circuit 12 converts a voltage of the commercial power supply 15 into an AC voltage that varies within a range between the limit voltage "−Vc" and the limit voltage "+Vc".

Figure 8:
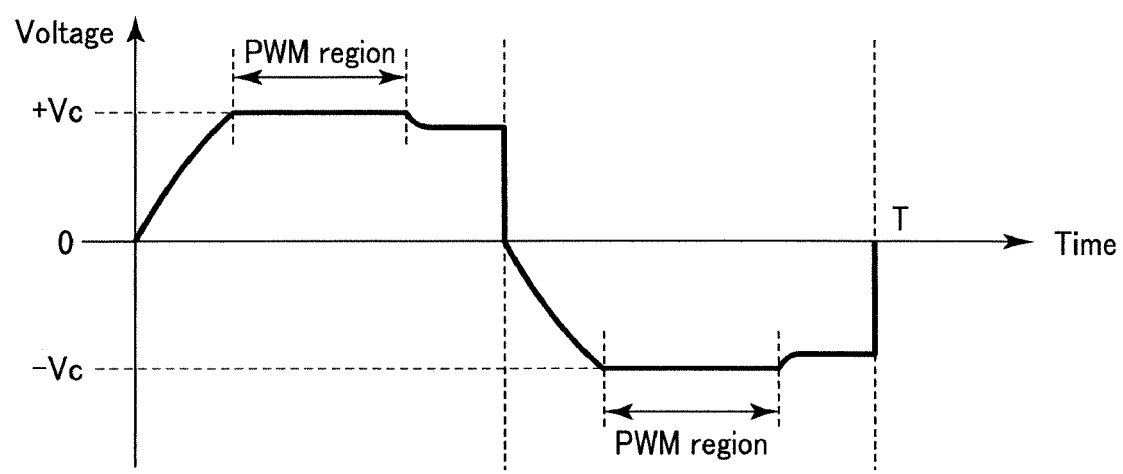
FIG. 8 is a diagram for explaining an AC voltage applied to the light control element according to the first embodiment.

FIG. 8 is a diagram for explaining an AC voltage applied to the light control element 11. In a PWM region of the AC waveform, a pulse voltage generated by the transistor T1 is smoothed out by the low pass filter LPF, and set to be approximately equal to the limit voltage "+Vc". The same applies to the limit voltage "−Vc". An AC voltage that varies within a range between the limit voltage "+Vc" and the limit voltage "−Vc" is then applied to the light control element 11.

[3] Modification

Figure 9:
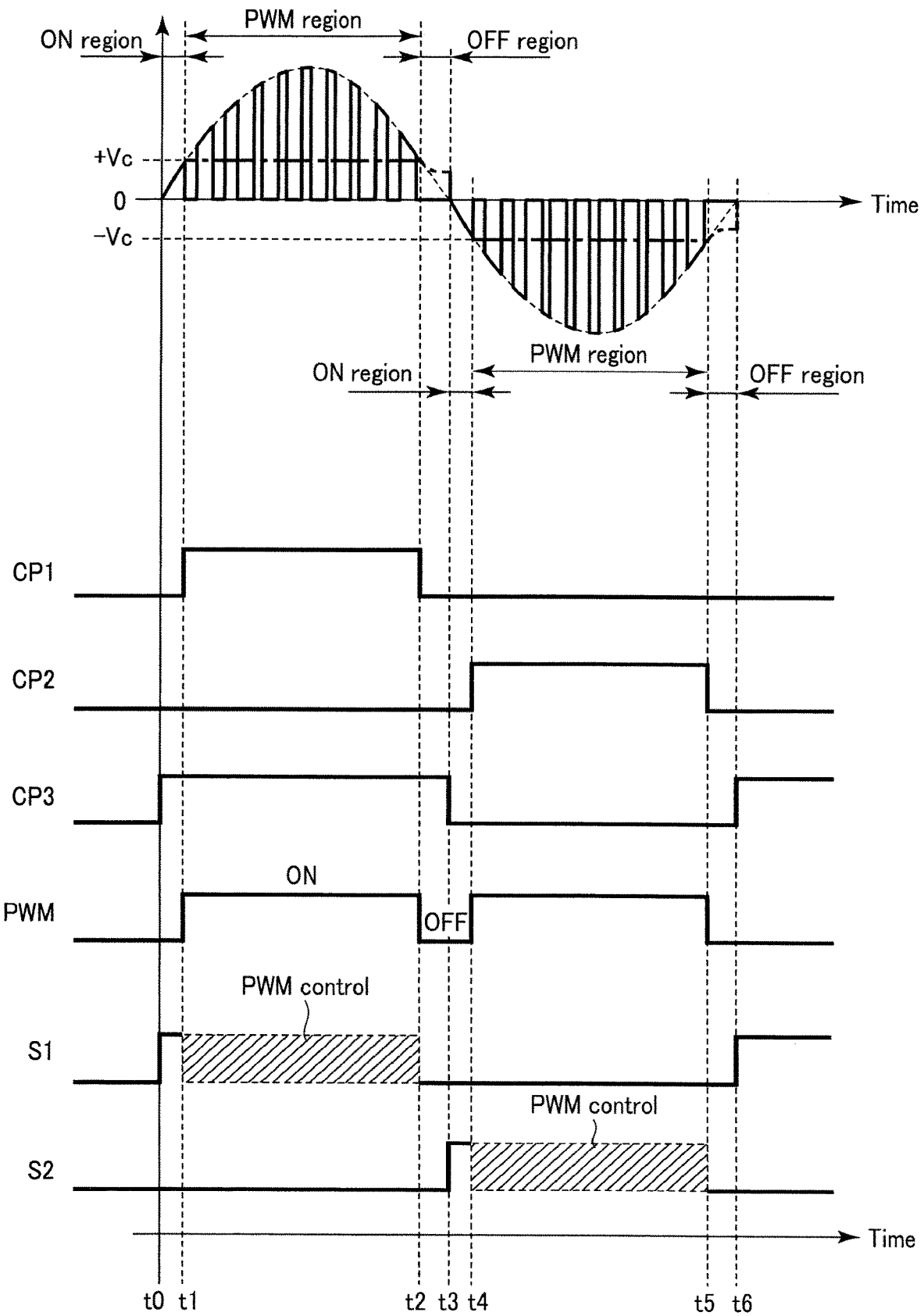
FIG. 9 is a timing chart for explaining operations of a drive circuit according to a modification.

Next, a modification of the first embodiment will be described. The modification describes an example of generating an AC waveform when the limit voltage Vc of the light control element 11 is lower; for example, half of the maximum value Vm or less. FIG. 9 is a timing chart for explaining an operation of the drive circuit 12 according to the modification of the first embodiment.

The reference voltage "VrefC+" of the variable power supply 32 is optimally set in accordance with the limit voltage "+Vc", and the reference voltage "VrefC−" of the variable power supply 34 is optimally set in accordance with the limit voltage "−Vc".

The period from t1 to t2 corresponding to the PWM region is longer in the modification than that of the first embodiment shown in FIG. 7. Similarly, the period from t4 to t5 corresponding to the PWM region is longer in the modification than that of the first embodiment shown in FIG. 7.

To decrease the limit voltage "+Vc", it is only necessary to extend the period of PWM control while narrowing the width of a pulse signal. Similarly, to increase the limit voltage "−Vc", it is only necessary to extend the period of PWM control while narrowing the width of a pulse signal.

In this manner, the limit voltage "+Vc" in the modification can be made lower than that of the first embodiment shown in FIG. 7. Furthermore, the limit voltage "−Vc" in the modification can be made higher than that of the first embodiment shown in FIG. 7. The other operations are the same as the operations of the first embodiment described above.

FIG. 10 is a diagram for explaining an AC voltage applied to the light control element 11 according to the modification. In the PWM region of the AC waveform, a pulse voltage is smoothed out by the low pass filter LPF and is set to be approximately equal to the limit voltage "+Vc". The same applies to the limit voltage "−Vc". Then, an AC voltage having a smaller amplitude than that of the first embodiment shown in FIG. 8 is applied to the light control element 11.

[4] Optical Characteristics of Light Control Element 11

Figure 11:
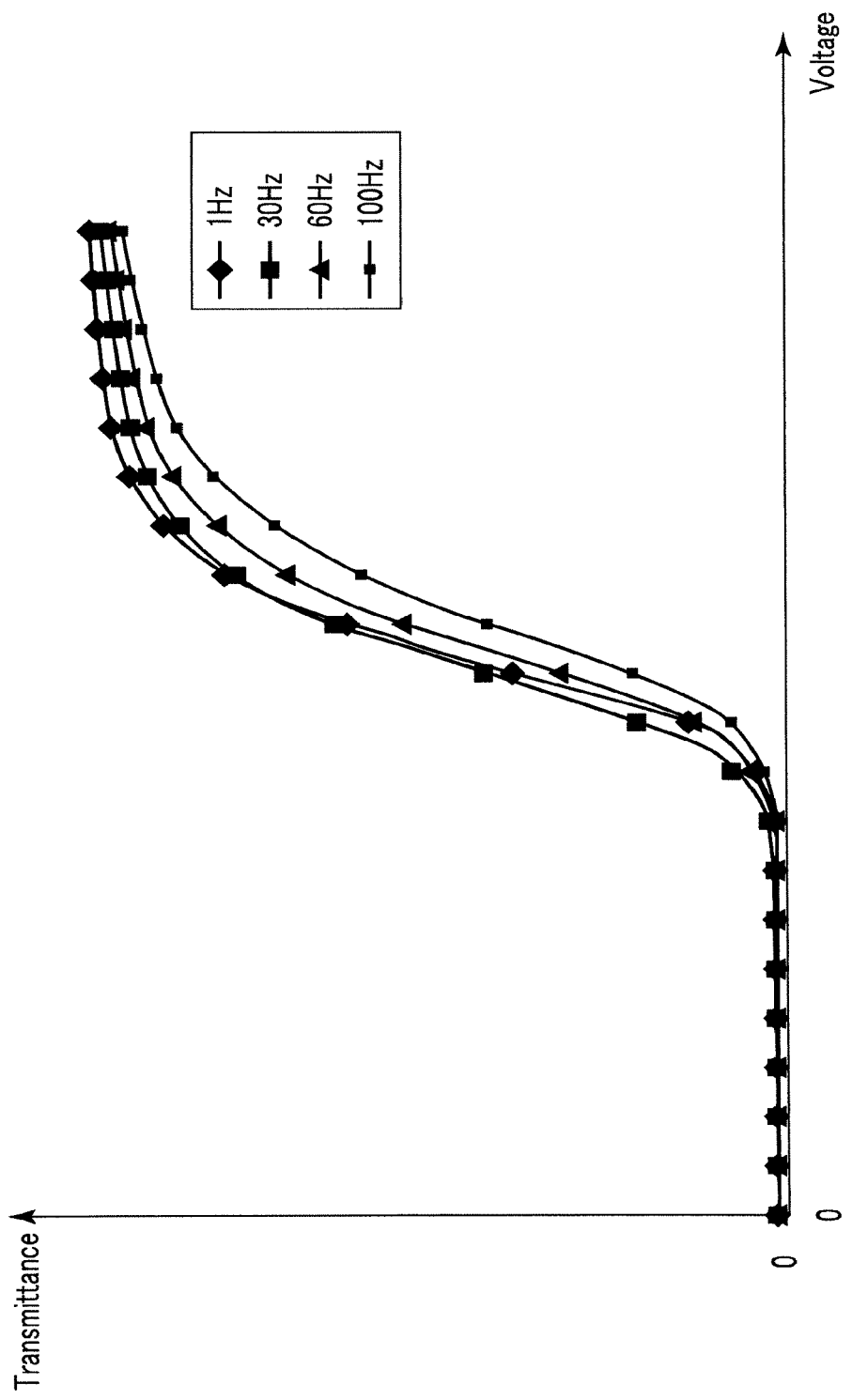
FIG. 11 is a set of graphs showing an example of V-T characteristics of the light control element.

Next, the optical characteristics of the light control element 11, that is, the voltage-transmittance (V-T) characteristics will be described. FIG. 11 is a set of graphs showing an example of V-T characteristics of the light control element 11. In FIG. 11, the horizontal axis presents a voltage (V) while the vertical axis presents a transmittance (%), and both axes adopt arbitrary units. The voltage shown in FIG. 11 is an effective voltage of the AC power supply. FIG. 11 shows four graphs obtained by changing the frequency of the AC power supply; that is, a graph with the frequency of 1 Hz, a graph with the frequency of 30 Hz, a graph with the frequency of 60 Hz, and a graph with the frequency of 100 Hz.

As can be understood from FIG. 11, the transmittance of the light control element 11 can be altered by changing the effective voltage applied to the light control element 11. Furthermore, the transmittance of the light control element 11 can be altered at will by changing the frequency of the AC power supply.

That is, in the above description of the operations, the limit voltages are defined with consideration towards the withstand voltage of the light control element 11. However, the transmittance of the light control element 11 can be altered at will by changing the voltages "+Vc" and "−Vc" within the range lower than the withstand voltage of the light control element 11. Furthermore, the transmittance of the light control element 11 can be altered at will by changing the frequency of the AC power supply. As described above, the voltage "+Vc" can be altered by changing the reference voltage "VrefC+" of the variable power supply 32, and the voltage "−Vc" can be altered by changing the reference voltage "VrefC−" of the variable power supply 34.

[5] Effects of First Embodiment

As described above in detail, in the first embodiment, the light control device 10 includes: the light control element 11 including a polymer dispersed liquid crystal or a polymer network liquid crystal; the transistors (switching elements) T1 and T2 connected in series between the commercial power supply 15 and the light control element 11; the diode (rectifying element) D3 connected in parallel to the transistor T1 and connected in the forward direction from the light control element 11 to the commercial power supply 15; and the diode (rectifying element) D4 connected in parallel to the transistor T2 and connected in the forward direction from the commercial power supply 15 to the light control element 11. The PWM switching circuit (control circuit) 38 is configured to perform the PWM control or PFM control on the transistor T1 when a voltage of the commercial power supply 15 is higher than the limit voltage "+Vc" that is higher than 0 V and is lower than the maximum value of the commercial power supply 15, and to perform the PWM control or PFM control on the transistor T2 when a voltage of the commercial power supply 15 is lower than the limit voltage "−Vc" that is higher than the minimum value of the commercial power supply 15 and is lower than 0 V.

Therefore, according to the first embodiment, the light control device 10 can be driven using the commercial power supply 15 that is a general power supply supplied from an electric power company, etc., for industrial use or household use. In addition, deterioration of the liquid crystal layer 24 included in the light control element 11 can be suppressed.

If an AC waveform is generated in an analog manner using analog elements, power consumption increases and the amount of heat generation increases. In this respect, however, in the present embodiment, the amplitude of an AC voltage is made small using the PWM control, so that power consumption can be reduced and the amount of heat generation can also be reduced.

In addition, since the amount of heat generation can be reduced, there is no need for a heat dissipation device. In addition, a slidac (variable auto-transformer) for stepping down the commercial power supply 15 is unnecessary. Therefore, the device can be downsized.

Furthermore, the comparator CP1 is caused to compare the reference voltage "VrefC+" of the variable power supply 32 with the AC voltage obtained by stepping down the commercial power supply 15, and based on this comparison result, a voltage lower than the limit voltage "+Vc" is applied to the light control element 11. Therefore, the limit voltage "+Vc" can be altered at will by changing the reference voltage "VrefC+". As a result, the transmittance of the light control element 11 can be changed at will.

The commercial power supply 15 is used without any change for a voltage between the limit voltage "+Vc" and the limit voltage "−Vc". Accordingly, the power loss can be further reduced.

Second Embodiment

The second embodiment is configured in a manner such that an AC voltage is partially or periodically thinned out.

Figure 12:
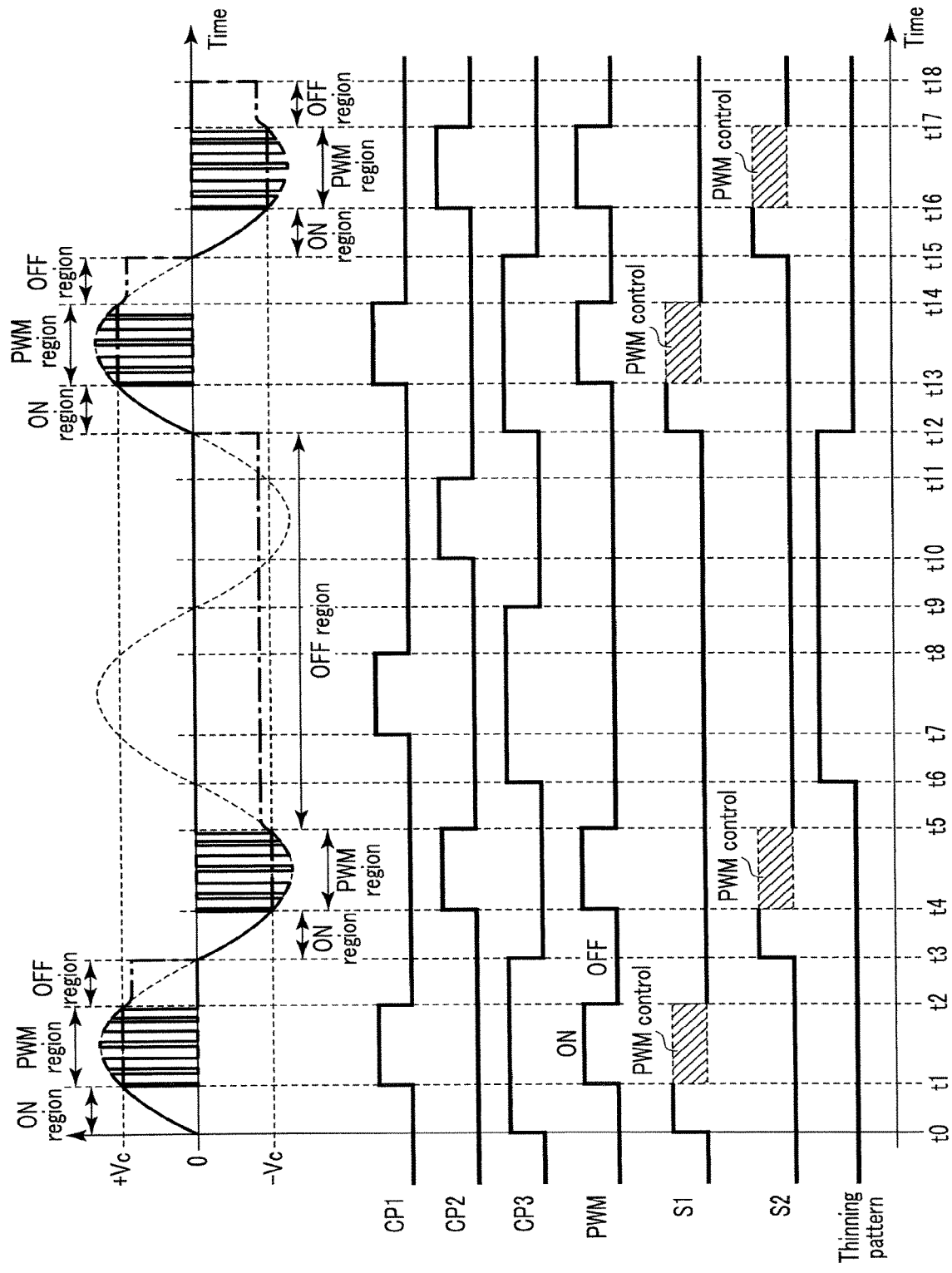
FIG. 12 is a timing chart for explaining operations of a drive circuit according to a second embodiment.

FIG. 12 is a timing chart for explaining operations of the drive circuit 12 according to the second embodiment of the present invention. The operations from time t0 to time t6 are the same as the operations of the first embodiment shown in FIG. 7.

As shown in FIG. 5, the thinning circuit 40 receives an output of the comparator CP3 for detecting zero crossing. The thinning circuit 40 sends a thinning pattern to the timing generation circuit 39.

The thinning circuit 40 outputs a low level as a thinning pattern from time t0 to time t6. For example, when the thinning pattern is a low level, the timing generation circuit 39 generates a signal for causing the transistors T1 and T2 to perform switching operations.

At time t6, the comparator CP3 for zero crossing outputs a high level. Upon receipt of an output of the comparator CP3, the thinning circuit 40 outputs a high level as a thinning pattern. The timing generation circuit 39 turns off the transistors T1 and T2 in a period in which the thinning pattern is a high level. In a period in which the transistors T1 and T2 are turned off, a voltage applied to the light control element 11 is maintained by the capacitive load CL of the light control element 11.

At time t12, the comparator CP3 for zero crossing outputs a high level. Upon receipt of an output of the comparator CP3, the thinning circuit 40 outputs a low level as a thinning pattern. In a period in which the thinning pattern is a low level, the timing generation circuit 39 generates a signal for causing the transistors T1 and T2 to perform switching operations. Accordingly, an AC voltage is applied to the light control element 11. Thereafter, the similar control is performed, and the drive circuit 12 converts a voltage of the commercial power supply 15 into an AC voltage that varies within a range between the limit voltage "−Vc" and the limit voltage "+Vc".

A period in which the commercial power supply 15 is thinned out (that is, a thinning pattern by the thinning circuit 40) can be freely set. For example, an AC voltage may be thinned every other cycle, that is, an AC voltage may be thinned only for one of two cycles. In this case, a waveform having a frequency equal to half of a frequency of the commercial power supply 15 can be generated. For example, when a frequency of the commercial power supply 15 is 60 Hz, an AC voltage having a frequency of 30 Hz can be generated. For example, an AC voltage may be thinned for one cycle every two cycles; that is, an AC voltage may be thinned only for one of three cycles.

The thinning circuit 40 counts the number of rising edges of output of the comparator CP3 for zero crossing and sets a period for thinning out an AC voltage in accordance with a count value.

According to the second embodiment, power consumption of the transistors T1 and T2 can be reduced in a period in which an AC voltage is thinned out. This achieves a reduction of power consumption of the light control device 10.

In addition, a time period in which the transistors (MOS transistors) T1 and T2 are turned on can be shortened by thinning out an AC voltage. This makes it possible to decrease the size of the MOS transistors T1 and T2. The MOS transistors decreased in size require less power consumption and less heat generation, thereby realizing the reduction of the power consumption and the amount of heat generation of the light control device 10. The other effects are the same as those in the first embodiment.

EXAMPLES

In each of the embodiments described above, the liquid crystal element (light control element) using PDLC or PNLC has been described as an example; however, the present invention is not limited to this. The liquid crystal element may have a configuration in which a polarizing plate and an alignment film are disposed on both sides of a liquid crystal layer, and may employ a TN (Twisted Nematic) method, a VA (Vertical Alignment) method, an IPS (In-Plane Switching) method, etc. In addition, other than the liquid crystal element, various types of electro-optical elements in which the refractive index changes with voltage can be used as the light control element.

Other than the MOS transistor or bipolar transistor, the switching elements T1 and T2 described in each of the above embodiments may be formed of a SiC-MOSFET using silicon carbide (SiC) for a semiconductor layer, a GaN-MOSFET using gallium nitride (GaN) for a semiconductor layer, etc.

The rectifying elements D3 and D4 described in each of the above embodiments may be formed of, other than the diode, a Schottky diode, a fast recovery diode (FRD), a SiC diode, a GaN diode, a MOS diode, etc.

Each of the above embodiments has been described using a commercial AC power supply (commercial power supply) as an example of an AC power supply. However, the present invention is not limited to this, and may adopt an AC power supply of various waveforms.

The light control device described in each of the above embodiments is applicable to windows and indoor partitions in homes, offices or public facilities, image projection screens and signage in commercial facilities or event venues, windows and sunroofs in vehicles (cars) or aircrafts, etc.

For example, in a vehicle or the like, when a DC power supply (battery) is used as a power supply source, an AC power supply is generated using a D/A converter. The light control device according to the present embodiment is also applicable to an AC power supply obtained by converting a DC power supply.

In each of the above embodiments, the light control element has been described as an example of the liquid crystal element. However, the present invention is not limited thereto, and is applicable to various devices (including a liquid crystal display device) using liquid crystal.

The present invention is not limited to the above-mentioned embodiments, and can be reduced to practice by modifying the constituent elements without departing from the spirit and scope of the invention. In addition, the above-described embodiments include inventions of various stages, and a variety of inventions can be derived by properly combining structural elements of one embodiment or by properly combining structural elements of different embodiments. For example, if the object of the invention is achieved and the advantages of the invention are attained even after some of the structural elements disclosed in connection with the embodiments are deleted, the structure made up of the resultant structural elements can be extracted as an invention.

The invention claimed is:

1. A light control device comprising:
a light control element including a first layer stack and a second layer stack which include electrodes provided on base members, respectively, and a liquid crystal layer sandwiched between the first and second layer stacks;
a first switching element connected between an AC power supply and the light control element;
a first comparator that detects whether or not the AC power supply is higher than a first voltage that is higher than 0 V and is lower than a maximum value of the AC power supply; and
a control circuit that performs PWM (pulse width modulation) control or PFM (pulse frequency modulation) control on the first switching element if the AC power supply is higher than the first voltage.

2. The light control device according to claim 1, wherein the control circuit turns on the first switching element, and applies the AC power supply without any change to the light control element if the AC power supply is lower than the first voltage.

3. The light control device according to claim 1, wherein the control circuit alters a transmittance of the light control element by changing a period in which the PWM control or the PFM control is performed.

4. The light control device according to claim 1, further comprising a thinning circuit that thins out an AC voltage that is applied to the light control element, for at least one cycle.

5. The light control device according to claim 4, further comprising a second comparator that detects timing at which the AC power supply becomes 0 V,
wherein the thinning circuit determines the cycle using an output of the second comparator.

6. The light control device according to claim 1, further comprising:
a voltage dividing circuit that generates a first AC voltage by dividing the AC power supply; and
a DC power supply that generates a reference voltage,
wherein the first comparator detects whether or not the AC power supply is higher than the first voltage by comparing the first AC voltage with the reference voltage.

7. The light control device according to claim 6, further comprising a limiter that freely changes the first voltage in accordance with the reference voltage.

8. The light control device according to claim 7, further comprising an error amplifier that applies, to the light control element, a voltage of a level same as that of the first voltage changed by the limiter,
wherein voltage application to the light control element is performed through the error amplifier.

9. The light control device according to claim 1, further comprising a rectifying element that is connected in parallel to the first switching device, and is connected in a forward direction from the light control element to the AC power supply.

10. The light control device according to claim 1, further comprising:
a second switching element connected between the first switching element and the light control element; and
a third comparator that detects whether or not the AC power supply is lower than a second voltage that is higher than a minimum value of the AC power supply and is lower than 0 V, wherein the control circuit performs PWM control or PFM control on the second switching element if the AC power supply is lower than the second voltage.

* * * * *